United States Patent [19]

Englert et al.

[11] Patent Number: 5,247,703
[45] Date of Patent: Sep. 21, 1993

[54] TRANSCEIVER WITH OFF HOOK SCANNING

[75] Inventors: John W. Englert, Carmel; Ben F. McCormick, II, Fishers, both of Ind.

[73] Assignee: Relm Communications, Inc., Indianapolis, Ind.

[21] Appl. No.: 701,654

[22] Filed: May 16, 1991

[51] Int. Cl.⁵ .......................... H03J 7/18; H04B 1/44
[52] U.S. Cl. .................................. 455/77; 455/161.2; 455/166.2
[58] Field of Search ................. 455/77, 76, 78, 161.1, 455/161.2, 165.1, 166.1, 166.2, 186.1, 32.1

[56] References Cited

U.S. PATENT DOCUMENTS

| Re. 31,523 | 2/1984 | Baker | 455/76 |
|---|---|---|---|
| 3,764,912 | 9/1973 | Abraham et al. | |
| 3,943,444 | 3/1976 | Lundberg | |
| 4,180,776 | 12/1979 | Lindemann | |
| 4,207,522 | 6/1980 | Thornton et al. | 455/77 |
| 4,287,599 | 9/1981 | Gonscharoff et al. | 455/77 |
| 4,430,755 | 2/1984 | Nadir et al. | 455/77 |
| 4,484,357 | 11/1984 | Fedde | 455/166 |
| 4,608,712 | 8/1986 | Fedde | 455/166.2 |
| 4,625,331 | 11/1986 | Richardson et al. | 455/166.1 X |
| 4,905,302 | 2/1990 | Childress et al. | 455/32.1 |

*Primary Examiner*—Reinhard J. Eisenzopf
*Assistant Examiner*—Chi M. Pham

*Attorney, Agent, or Firm*—Allegretti, Witcoff, Ltd.

[57] ABSTRACT

A transceiver that allows scanning to occur with the microphone in an off hook position. The transceiver includes a main unit, external microphone, and hook for holding the microphone. The external microphone includes a push-to-talk button, which may be pressed in order to allow audio signals to be converted into electrical talk signals and sent to the main unit. The main unit scans a plurality of channels according to a predetermined sequence. One channel is designated as a "priority" channel. Scanning continues when the microphone is off hook. When the unit detects channel activity on a specific channel that it is monitoring at a particular time, it discontinues the scanning both during the channel activity and for a predetermined wait period after the absence of such activity on the specific channel. Should a talk signal occur within the wait period following activity on the specific channel, the talk signal is processed on the specific channel. However, the talk signal may occur during scanning rather than soon after channel activity on the one specific channel. In this case, the talk signal is processed on the priority channel rather than on any other specific channel. The decision to process and transmit the talk signal on a specific channel or on the priority channel is made "automatically," depending on when the push-to-talk button is depressed.

24 Claims, 6 Drawing Sheets

TRANSCEIVER WITH OFF HOOK SCANNING

BACKGROUND OF THE INVENTION

The present invention relates generally to radio communications apparatus and, more particularly, to an apparatus that may both receive and transmit radio frequency ("RF") signals and that can scan a plurality of channels over a predetermined sequence.

Such mobile transceivers, including, for example, land-based mobile radios, often include a memory that may be loaded with a predetermined sequence, or "listing," of specific channels. Such mobile transceivers generally include a main unit, microphone, and hookswitch. The main unit may be mounted, for example, onto a dashboard of an automotive vehicle. It receives and processes RF signals to give an audible signal to the transceiver operator.

The microphone includes a push-to-talk ("PTT") button. When depressed, a sound signal received by the microphone may be converted to an electrical signal and sent to the main unit to be transmitted over a particular channel.

The hook physically holds the microphone in a predetermined position when not in use, such as, for example, on the side of the main unit. When in the condition of being in the predetermined position, the microphone is described as being "on hook." Conversely, when detached, the microphone is described as being "off hook." A typical transceiver may be adjusted to work in either manual or scan mode. While in manual mode, the operator may easily select a particular channel in the transceiver memory or, alternatively, may select any other channel within the range of the transceiver. It will then process RF signals received on a selected channel and broadcast them over a speaker to the transceiver operator. Similarly, the operator may take the microphone off hook, press the PTT button, and transmit a message over the selected channel.

While in scan mode, the transceiver may serially scan from one channel to another, according to a predetermined sequence in memory and note any channel activity (signals received over the selected channel). If no signal is received over a predetermined period of time (such as 0.04 to 0.40 seconds) the transceiver will move to the next channel, according to the predetermined serial sequence of channels in memory.

While the transceiver remains in scan mode, the operation of moving from one specific channel to another continues until an RF signal is detected on a particular channel. The scanning then is temporarily discontinued, and the transceiver monitors the active channel. If activity stops on the predetermined channel, the transceiver begins again the scanning operation, moving to the next predetermined channel, according to the chosen sequence in memory.

Typically, the scanning procedure continues only when the microphone transceiver is on hook. Current commercial mobile transceivers discontinue scanning when the microphone is taken off hook, in preparation for the operator beginning to transmit.

Most mobile transceiver systems utilize a priority scanning system in which one specific channel is "prioritized" over other channels. With such systems, the normal scanning procedure only continues when the microphone is on hook and there is no activity on the priority channel. Whenever the microphone is taken off hook or there is activity on the priority channel, scanning stops, and the transceiver switches to the priority channel. The operator may then monitor the priority channel and, if there is no activity on the channel, transmit over the priority channel.

Such transceivers include limitations that are poorly suited to meet the needs of many mobile transceiver operators, particularly those driving vehicles. Often, for example, a transceiver operator may hear an audio message while the transceiver is in scan mode and wish to transmit a response on the same channel.

The operator must then reach to the main unit to take the microphone off hook. If the transceiver has reverted to the priority channel, he or she must then use a manual input device on the main unit to select the channel he or she believes the last transmission was made on. Such operations are cumbersome, especially while driving and particularly when driving an emergency vehicle in response to a call for assistance. In such cases, the driver's attention may be focused elsewhere than on the efforts to manually select a channel on a transceiver.

Overcoming such limitations by simply allowing the operator to transmit by pushing the PTT button during the scanning operation would cause great difficulties. For proper operation of a transceiver, an operator should monitor a particular channel before he or she transmits on it. Allowing an operator to transmit during the scanning process might result in transmissions on random channels, dependent only on what channel the transceiver happened to be locked onto during the scanning process. Such a procedure would not allow the operator to monitor a channel before transmitting on it. Moreover, in many instances, the operator may wish to transmit over the priority channel quickly without reaching to the main unit to adjust the manual controls or waiting for the transceiver to scan to priority channel.

SUMMARY OF THE INVENTION

In a principle aspect, the present invention is a method for controlling the channels used for scanning and transmitting by a mobile transceiver. The transceiver includes a main unit, external microphone, and hookswitch for holding the microphone.

The main unit may scan a plurality of channels, including a specific channel which has been designated as a priority channel. The external microphone includes a talk button which may be pushed down to allow audio signals to be converted to an electrical "talk" signal and sent to the main unit. The hookswitch physically holds the microphone in a predetermined position relative to the main unit and provides a logic signal for use by a controller to determine that the microphone is in the predetermined position.

The method of the present invention includes the steps of scanning the signals over a predetermined sequence of channels and maintaining the scanning, even when the microphone is off hook. Activity on a specific channel scanned is detected, and the scanning of a plurality of channels is interrupted for a predetermined wait time after activity on the channel has been noted.

The scanning process is discontinued when the talk button on the microphone is pushed. A talk signal from the microphone may then be processed and transmitted on the specific channel on which channel activity was noted, if the talk signal from the microphone occurs during the wait time. Alternatively, when channel activity has not been detected on the specific channel during the wait time, the talk signal is processed and transmitted on the priority channel.

The scanning of signals begins again over the predetermined sequence of channels after the microphone is even momentarily placed on hook. The scanning may also begin after the main unit receives a manual input from the operator that he or she wishes to begin the scanning operation once again, even though the microphone remains off hook.

In another aspect, the present invention is a mobile scanning transceiver for receiving signals on a plurality of channels. As before, the mobile scanning transceiver includes a main unit, external microphone, and hook. The main unit receives signals on a plurality of channels and selectively processes channels through a speaker. The external microphone receives the audio signals from the operator and sends an electrical talk signal to the main unit. The hook physically holds the microphone in a predetermined position relative to the main unit. The hook further provides an off hook signal to the main unit when the microphone is removed from the predetermined position.

The main unit includes a signal processor, memory, and controller. The signal processor processes "outgoing" talk signals for transmission and "incoming" channel signals for audible representation to the transceiver operator. The memory stores a predetermined sequence of channels, as well as a priority channel. The memory also provides channel information to the controller.

The controller instructs the signal processor to process, or scan, selected channels according to the predetermined sequence stored in the channel memory. This process of scanning channels continues even when the microphone is taken off hook.

The controller may detect activity on a particular channel. When it does so, it discontinues scanning during such activity and for a predetermined wait period thereafter. Should a priority talk signal be received during the wait period, the controller will instruct the channel selector to process the talk signal on the selected channel. Should a priority talk signal occur during the scanning process, however, the controller instructs the signal processor to process the talk signal on the priority channel.

Thus, an object of the present invention is an improved mobile scanning transceiver and a method for controlling the channels used for scanning and transmitting by a mobile transceiver. Another object of the present invention is a transceiver that is less cumbersome to use and more suitable for two-way communication.

Still another object is an improved mobile transceiver, that includes a main unit and external microphone, which allows an operator to more easily have the transceiver continue scanning over a predetermined sequence of channels, both while the microphone is on hook and after the microphone is taken off hook. Still another, related object is an improved transceiver that more readily allows the scanning of channels to continue with a microphone laying within the operator's hand or laying comfortably alongside her or him. Another object is a transceiver that will allow an operator to more easily respond to a message on the same channel on which the message was received.

Still another object is an improved transceiver that will more readily transmit over a current, non-priority channel if activity has occurred on that current channel within a predetermined wait period. A still further object is an improved transceiver that will transmit over the priority channel, if activity has not been detected recently on the current channel. Still yet another object is an improved transceiver that automatically selects between transmitting over the current or priority channel, without distracting the transceiver operator. These and other objects, features, and advantages of the present invention are discussed in the following description.

BRIEF DESCRIPTION OF THE DRAWINGS

A preferred embodiment of the present invention is described herein with reference to the drawings wherein.

DETAILED DESCRIPTION OF THE PREFERRED EMBODIMENT

Figure 1:
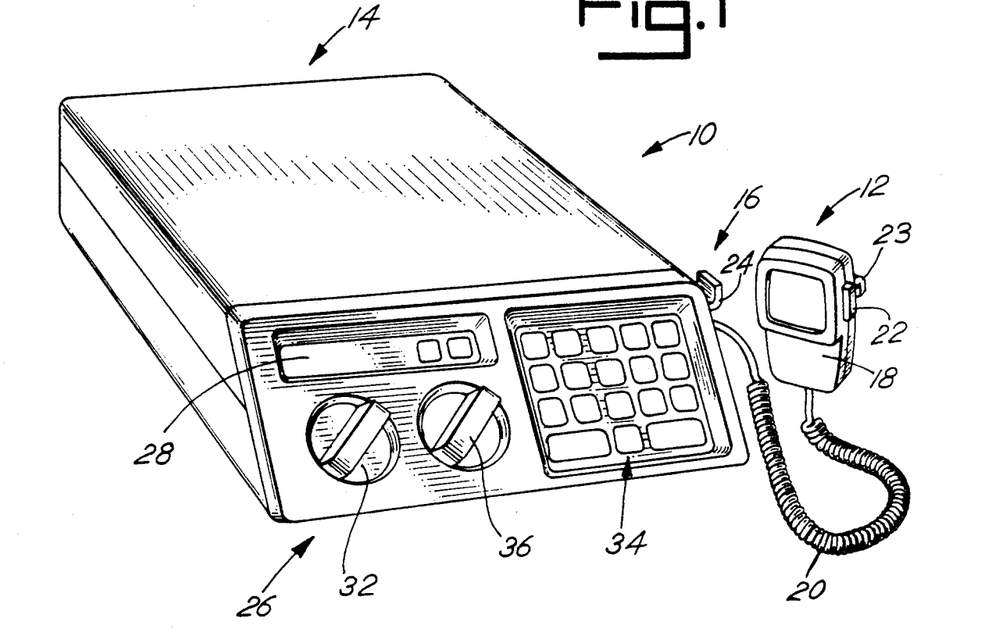
FIG. 1 is a perspective view of the present invention.
Figure 2:
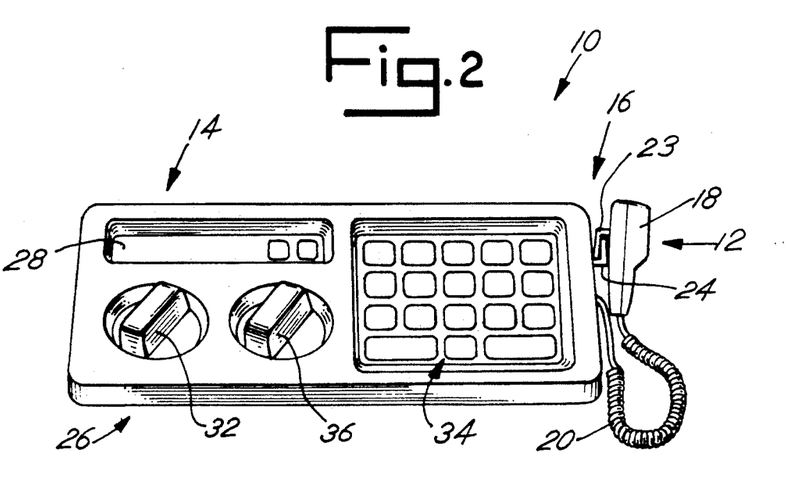
FIG. 2 is a front plan view of the preferred embodiment shown in FIG. 1.

Referring to FIGS. 1-5, the preferred embodiment of the present invention as shown as a mobile scanning transceiver 10. As shown in FIGS. 1 and 2, the transceiver 10 includes a microphone 12, main unit 14, and hook 16.

The microphone 12 includes a handheld transducer 18 and connecting cable 20. The transducer 18 includes a push-to-talk ("PTT") button 22. When the PTT button 22 is depressed or otherwise activated, the transducer 18 converts audio signals to an electrical "talk signal," which is sent to the main unit 14 via the connecting cable 20.

The hook 16 is an apparatus to physically hold the microphone 12 in a fixed position relative to the main unit 14. In the present embodiment, the hook 16 is made of metal and includes a male section 23, attached to the transducer 18, and a female section 24, attached to the main unit 14. As shown in FIG. 2, when the male section 23 is inserted into the female section 24, the microphone 12 is held in a substantially fixed position on the side of the main unit 14.

When the microphone 12 is in such a condition (called "on hook") an electrical signal is received by the main unit 14. In the preferred embodiment, the female section 24 of the hook 16 is interconnected to a substantially ground electrical potential. When the male section 23 of the hook 16 is placed in contact with the female section 24, the male section 23 is also reduced to a substantially ground electrical potential. The microphone 12 accordingly transmits a ground, or "on hook," signal to the main unit 14, via the cable 20. Of course, other proximity detectors, such as magnetic sensors or miniature switches, could also be used in place of the presently described apparatus for detecting when the microphone 12 is on and off hook.

The main unit 14 includes external manual controls 26, a visual display 28, and internal circuitry 30. The external manual controls 26 include a control for both powering the transceiver 10 on and off and adjusting the volume 32 and a key pad 34. In some embodiments, the main unit 14 may also include an external squelch control 36 (rather than a purely internal squelch control that is not adjustable by the operator).

The key pad 34 allows the operator to instruct the transceiver 10 as to its mode of operation. For example, such instructions include whether the transceiver 10 should operate in manual or scan mode and, if in scan mode, what channels the transceiver 10 should sample, or move between. The visual display 28 advises the operator, for example, what channel is currently being used or sensed and whether the transceiver 10 is operating in manual or scan mode.

Figure 3:
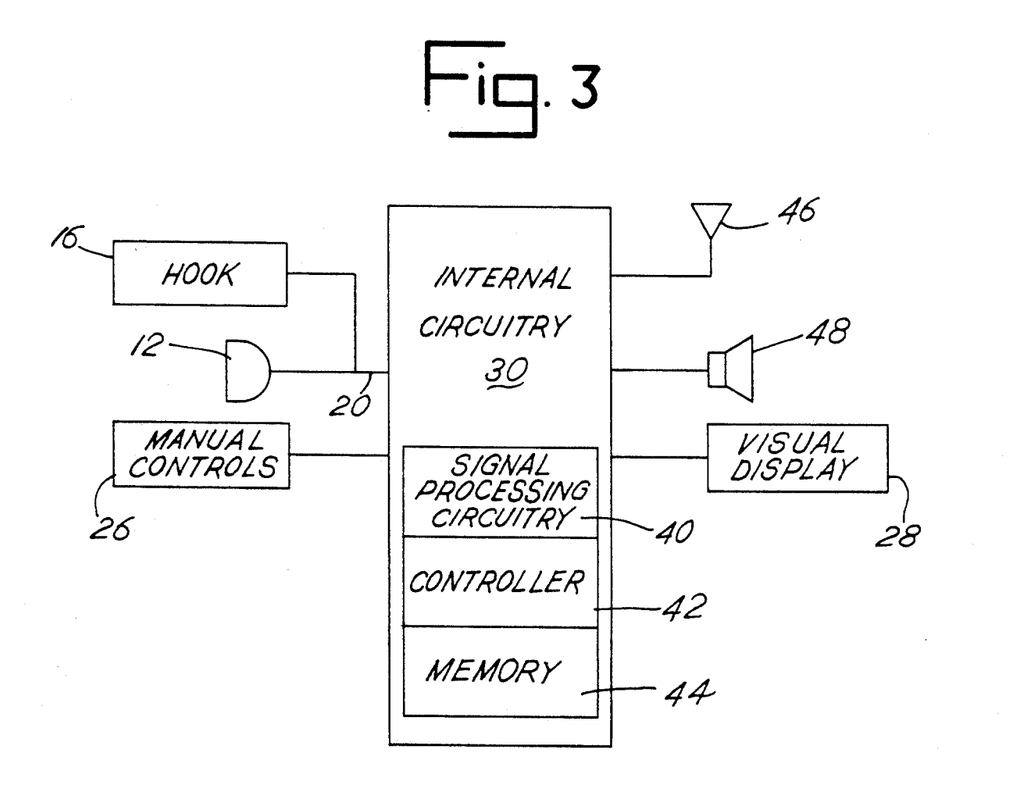
FIG. 3 is a basic block diagram of the preferred embodiment shown in FIG. 1.
Figures 4, 4B:
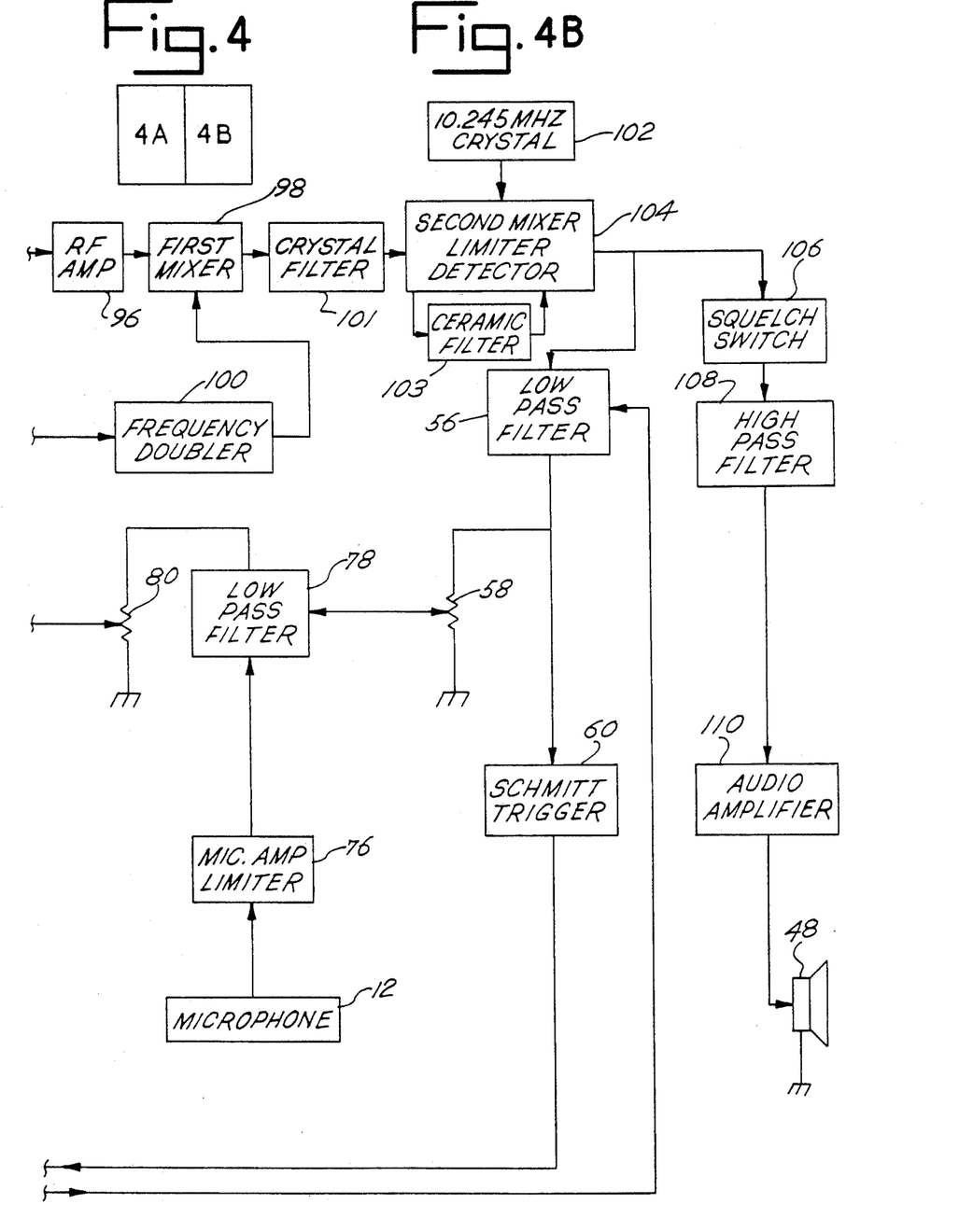
FIGS. 4, 4A and 4B are detailed block diagram of the preferred embodiment shown in FIG. 1.
Figure 4A:
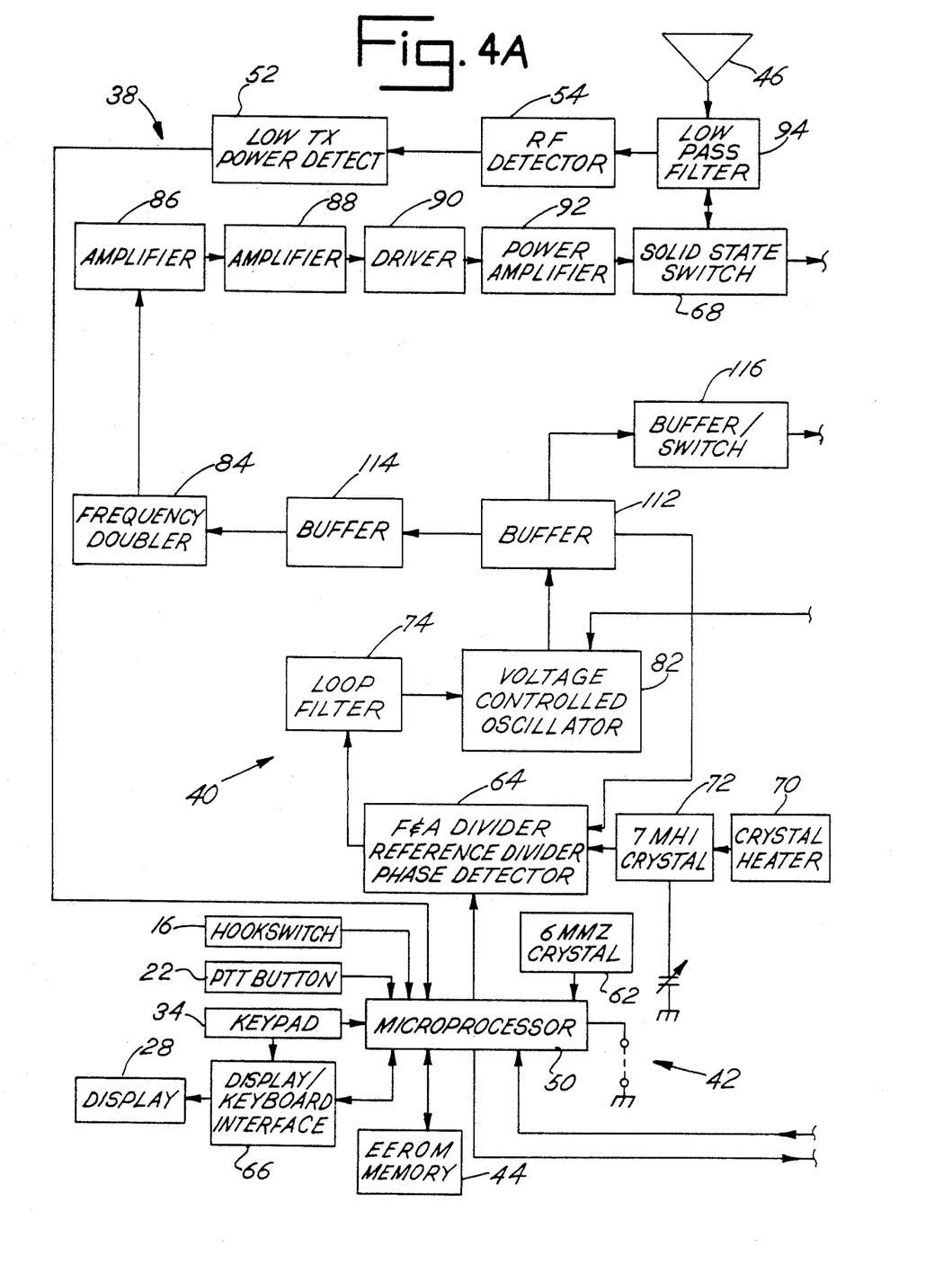

A basic block diagram of major control circuitry of the transceiver 10 is shown in FIG. 3. FIG. 4 shows a more detailed block diagram of the internal circuitry 30 and other components of the transceiver 10. Since the structure and operation of a variety of transceivers are well known by those of ordinary skill in the art, FIGS. 3 and 4 are shown only as an examples of possible configurations of the present invention. As will be recognized by those of ordinary skill in the art, many of the functions of a transceiver have been simplified or combined in FIGS. 3 and 4 for purposes of illustration.

FIG. 3 shows that the internal circuitry 30 includes signal processing circuitry 40, a controller 42, and a memory 44. The transceiver 10 may further include an external antenna 46 and an internal speaker 48. The signal processing circuitry 40 processes talk signals and channel signals. The controller 42 instructs the signal processing circuitry 40. The controller 42 further includes a decoder for decoding tones on specific channels and for inhibiting the processing of talk signals on a specific channel when the tone decoded on the specific channel is incorrect, in accordance with commands entered into the controller 42 by the dealer.

The memory 44 stores a predetermined sequence of channels and a priority channel. The memory 44 also includes a tone memory of specific channels and corresponding correct tones. The memory 44 provides channel and tone information to the controller 42.

When the PTT button 22 is closed, or pressed, the transducer 18 converts an audio signal into an electrical talk signal and sends the talk signal along the cable 20 to the main unit 14 and the antenna 46. Internal commands are typically established by the dealer and limit the operation of the transceiver 10. For example, internal controls may be adjusted to only permit the transceiver 10 to transmit over particular channels.

The controller 42 receives a signal from the microphone 12. When enabled, the controller 42 modifies the talk signal from the microphone 12 and sends the modified signal to the antenna 46 for transmission. If the manual controls 26 have been adjusted for the transceiver 10 to be in scanning mode, the controller 42 picks a predetermined channel to monitor for activity.

If no activity is detected on the particular channel, the controller 42 then selects the next predetermined channel to monitor. When activity is detected on a particular channel, however, the controller 42 continuously monitors the same signal. Thus, the same particular channel continues to be monitored until the controller 42 no longer detects activity. The controller 42 monitors the particular channel for a pre-set wait time period after the channel activity has terminated.

Thereafter, but only after the wait time has elapsed, the controller 42 scans the next predetermined channel in sequence. This procedure continues when the hook 16 advises the controller 42 that the microphone 12 is on hook and as well as when the microphone 12 is initially taken off hook.

The operator may take the microphone 12 off hook and depress the PTT button 22. If the particular channel being monitored when the PTT button 22 is depressed has been designated as "improper," the controller 42 will purposefully not send a transmit signal to the antenna 46. Rather, the controller 42 will send a signal to the speaker 48, which will result in an audible alarm. This will advise the operator that transmitting over the particular channel chosen is impermissible. Similarly, the controller 42 will purposefully not send a signal to the antenna 46 should the operator attempt to transmit on an improper channel or when the controller 42 is already sensing channel activity on the particular channel being monitored. Instead, an audible alarm may be sounded.

However, once transmitting on the "current channel" (or the channel in which there has been actively during the last wait period during the scanning process) is permissible, the controller 42 will discontinue the scanning, keeping the transceiver 10 on the current channel. When a break in channel activity is detected, the controller 42 will allow the talk signal to be transmitted over the antenna 46. If, during the scanning process, however, the PTT button 22 is depressed, but no activity has been detected on the "current" channel, the controller 42 will then check for activity on the priority channel and, if there is none, will transmit over the priority channel.

During the process of scanning, transmitting, and receiving, the controller 42 continually updates the visual display 28 to advise the operator of the status of the transceiver's operation. After transmitting on the priority channel, the controller 42 will keep the transceiver 10 "locked into" the priority channel, until the controller 42 receives a signal from the hook 16, indicating that the microphone 12 is once again on hook, or from the external manual controls 26, instructing the controller 42 to again begin scanning.

Moreover, the controller 42 may be programmed to monitor the length of time that the PTT button 22 is activated. If the controller 42 is so programmed and the button 22 has been continuously activated for more than a predetermined period of time (which can range from 15 seconds to 6 minutes, or be disabled, depending on the commands entered by the dealer with an internal command input), the controller 42 sends a signal to the speaker 48. This will alert the operator that he or she may be accidentally activating the PTT button 22.

INTERNAL CIRCUITRY

A more detailed diagram of the internal circuitry 30 of the preferred embodiment of the transceiver 10 is shown in FIG. 4. The circuitry 30 is largely distributed on three Printed Circuit ("PC") boards (not explicitly shown): a main board; a Voltage Controlled Oscillator ("VCO") board and a control/display board. Each of the boards and their functions are discussed in more detail below.

MAIN BOARD

The main board contains the following circuits: Microprocessor; Voltage regulators; Control switching; Synthesizer; Transmitter audio; Frequency multiplier section; Amplifier, driver, and power amplifier; Transmit/Receive switch; Low pass filter; Receiver; and Receive audio. Each circuit is discussed separately below.

Microprocessor

The controller 42 is comprised of a microprocessor 50 and related circuitry. The present embodiment uses, for example, a ZILOG Z8610**B1 microprocessor made by SGS-Thomson Microelectronics. The microprocessor 50 monitors inputs, such as the front panel manual controls 26 and the memory 44, which, in the preferred embodiment, is an Electrically Erasable Read Only Memory ("EEROM"). The internal components other than the microprocessor 42 and memory 44 may be thought of, for convenience, as a signal processor.

The microprocessor 50 also interfaces with a synthesizer chip 64, the PTT button 22, the hookswitch 16, a programming jumper 42, tone circuitry 60, the key pad 34, a low TX power detector 52, an RF detector 54, a receiver squelch circuit 106, a transmitter enable line, the display 28, a display/keyboard interface 66, and the "beep," or alarm, signal sent to the speaker 48.

Continuous Tone-Controlled Squelch System ("CTCSS") Tones

CTCSS tones are both encoded and decoded by the microprocessor 50. The encoded tone is generated from signals from the microprocessor 50. These signals are summed together and then filtered by the low pass filter 56. The filtered CTCSS encoded signal is then applied through the tone deviation adjustment potentiometer 58 to the TX audio.

The filtered and shaped CTCSS received tone from the Schmitt Trigger 60 is tested by the microprocessor 50. If the microprocessor 50 is programmed for CTCSS on the receive channel and a carrier is present, the microprocessor 50 will test the signal. Carrier detection is accomplished by *momentarily* checking the squelch control line to determine whether the transceiver 10 is squelched or not. When a signal is received and the correct tone is present, the microprocessor 50 releases the squelch control line. The microprocessor 50 will also release the squelch control line when the microphone 12 goes off hook or the transceiver 10 is in Monitor Mode. The time base reference for the CTCSS tones comes from the microprocessor's 6 MHz oscillator crystal 62.

Receiver/Transmitter Frequency Codes

The receiver and transmitter frequency codes are controlled by the microprocessor 50. The microprocessor 50 takes the stored information from the EEROM 44 and serially loads the data into a synthesizer chip 64.

The programmed information for channels and the transceiver configuration is stored in the EEROM 44. Through the use of separate Latch lines for the synthesizer 64, display driver 66, and EEROM 44, the Data and Clock lines may be shared for all three devices, since only one of the three devices is enabled at one time.

Voltage Regulators

A +13.8 VDC supply voltage from the rear panel is sent to the ON/OFF switch 32. When the transceiver 10 is turned ON, +13.8 VDC is applied to 5 and 9.5 volt DC voltage regulators.

Synthesizer

The synthesizer is a system of networks connected to function as a multi-channel local oscillator, each channel derived via the microprocessor 50. The reference oscillator for the synthesizer is maintained above 0° C. by a heater circuit 70. This heats a crystal 72 and maintains ±5 PPM stability on the crystal 72 for both the receiver and the transmitter. Of course, as is known by those of ordinary skill in the art, there exist a variety of other methods to stabilize a crystal.

The reference frequency crystal 72 (7 MHz) is divided down to exactly 2.5 kHz. It is then compared, in the phase detector in the synthesizer 64, to the VCO frequency, which has also been divided down to 2.5 kHz through a variable modulus prescaler and an internal N divider in the synthesizer 64.

The phase detector output drives the VCO via a loop filter 74. The VCO is then locked at half the exact transmit or local oscillator frequency of the selected channel.

Transmitter Audio

Audio speech is converted from air pressure variations to an electrical signal by the microphone 12. Signal pre-emphasis results from the natural increase (6 dB/octave) in the microphone's output level with frequency. This signal is then amplified and limited by the limiter 76 so that the total system deviation does not exceed ±5 kHz.

A 4-pole active low pass filter 78 suppresses the audio sideband splatter of the transmitter signal. The output is fed to the master deviation adjustment potentiometer 80. This control is set by driving the modulation amplifier into full limiting and adjusting the potentiometer 80 for the specified maximum system deviation. The processed microphone signal is finally fed to a voltage controlled oscillator 82.

The low level CTCSS modulation signal provided by the microprocessor 50 passes through the low pass filter 56. It is applied to the transmitter audio low pass filter 78, which then also modulates the VCO.

Frequency Multiplier Section

The input to a frequency double 84 is one-half the carrier frequency. After passing through the doubler 84, the signal is "rich" in harmonics of the input frequency. A band pass filter allows the second harmonic to pass, while the fundamental and other harmonics are then attenuated. The signal is then amplified by the amplifier 86.

Amplifier, Driver, and Power Amplifier

An amplifier 88, driver 90, and power amplifier 92 are used to amplify the carrier signal to the required output power. The stages in this section operate in the Class C mode.

Transmit/Receive Switch

A Transmit/Receive antenna switch 68 moves between TX and RX modes, depending on the level of DC voltage applied. When the transceiver 10 is receiving, the antenna 46 is connected to the receiver. Primary power is supplied to the receiver only. When the PTT button 22 is pressed, the Transmit-Receive (T/R) circuitry switches the antenna 46 from the receiver's input to the transmitter's output.

Low Pass Filter

Harmonic suppression, which reduces the harmonics of the carrier below the level that is required by the FCC, is provided by the output of a low pass filter 94.

Receiver

The received signal passes through the low pass filter 94 and the solid state transmit/receive switch 68 before it is applied to the receiver front end. The signal then passes through two tracked-tuned, bandpass filter sections forming the input for the RF amplifier 96. Two more track-tuned, bandpass filters filter the output of the amplifier 96. The signal is then fed to a mixer 98.

The VCO output is doubled in frequency by the doubler 100 and then filtered by two track-tuned, bandpass filters. The resultant local oscillator signal, 10.7 MHz *below* the received signal, is applied to the mixer 98.

The mixer output is tuned for 10.7 MHz and then applied to a four-pole crystal filter 101. The filtered 10.7 MHz signal is fed to an IF Integrated Circuit 104. The IF IC contains the second local oscillator and second mixer. The second LO frequency is derived from a 10.245 MHz crystal 102, and the 10.7 MHz signal is the other input to the second mixer 104. The resultant second mixer output of 455 kHz is passed through a ceramic filter 103.

The filtered 455 kHz signal is then passed through a limiting amplifier and coupled to a quadrature detector. This quadrature detector converts the frequency modulated signal to an amplitude modulated (voltage) signal.

The input to the squelch circuit 106 has its amplitude set by a squelch potentiometer 36 (FIG. 1). It is restricted to high frequency audio, approximately 6 to 25 kHz, by the use of capacitors and resistors. The "noise" occurring in this range is amplified and detected. The DC voltage resulting from the detected "noise" activates muting the receiver. When a signal appears, the "noise" is reduced to a point where the detected noise signal is no longer sufficient to mute the audio.

Receive Audio

The audio output from the quadrature detector is applied to a de-emphasis circuit, and to the input of the low pass tone filter 56. The low pass filter amplifies the tone and filters out the audio voice signals. The output of the tone filter is fed into a Schmitt Trigger 60, which shapes the tone into the correct digital waveforms for the microprocessor 50 to decode the tones. If the correct tone is decoded, the microprocessor will turn a "Message" LED on and unmute the receive audio path.

The output of the de-emphasis circuit is fed to a squelch switch 106 and then applied to the audio highpass filter 108. This highpass filter reduces the amplitude of the tone signal in the receive audio path with a minimal effect to the overall receive audio. The audio highpass filter output is applied through the volume control 32 (FIG. 1) to the audio power amplifier 110. The output of the amplifier 110 drives the speaker 48.

VOLTAGE CONTROLLED OSCILLATOR ("VCO") BOARD

The voltage controlled oscillator circuitry is on the VCO board. The VCO is modulated by audio and tone during the transmit mode.

The VCO signal is buffered by the buffer 112 which is then applied into the RX drive and TX drive signals. The TX drive signal is buffered by the buffer 114 and then sent to the TX frequency doubler 84 on the main board.

The buffer 116 buffers the RX drive signal during the receive mode and shuts off the RX drive during transmit mode. The buffer 116 output is sent to the RX frequency doubler 100 on the main board.

CONTROL/DISPLAY BOARD

Visual Display 28

The display driver 66 receives its display information from the microprocessor 50 on the Data and Clock lines when enabled by the Latch line. The display driver 66 then controls the two-digit display, the Priority LED, the Message LED, and the Scan LED. The brightness of the display, LEDs, and key pad illumination are controlled by the microprocessor 50.

Key Pad

The key pad 34 is a 5×4 crosspoint matrix. Four column contacts are connected to the display driver 66. The remaining column contact is connected to ground. Whenever the keypad 34 is idle, the column lines are low, less than 0.8 V, and the row lines are high, greater than 2 VDC. When a contact is closed, the microprocessor 50 senses a change on one of the row lines and controls the display driver 66 to complete the decode for the column which was affected.

LOGIC SEQUENCE

Figures 5, 5B:
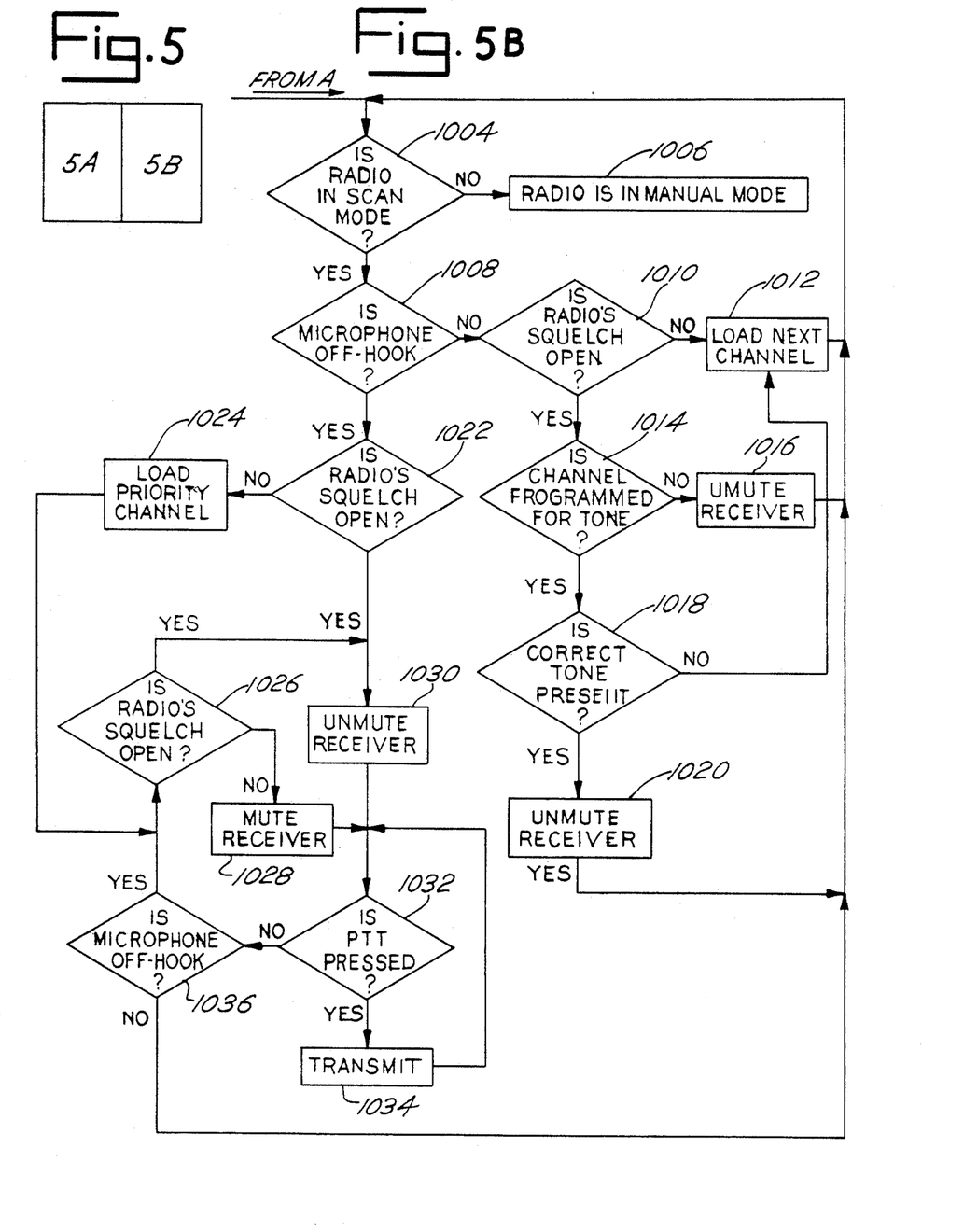
FIGS. 5, 5A and 5B are is a block diagram showing the logic followed by the controller shown in FIG. 3.
Figure 5A:
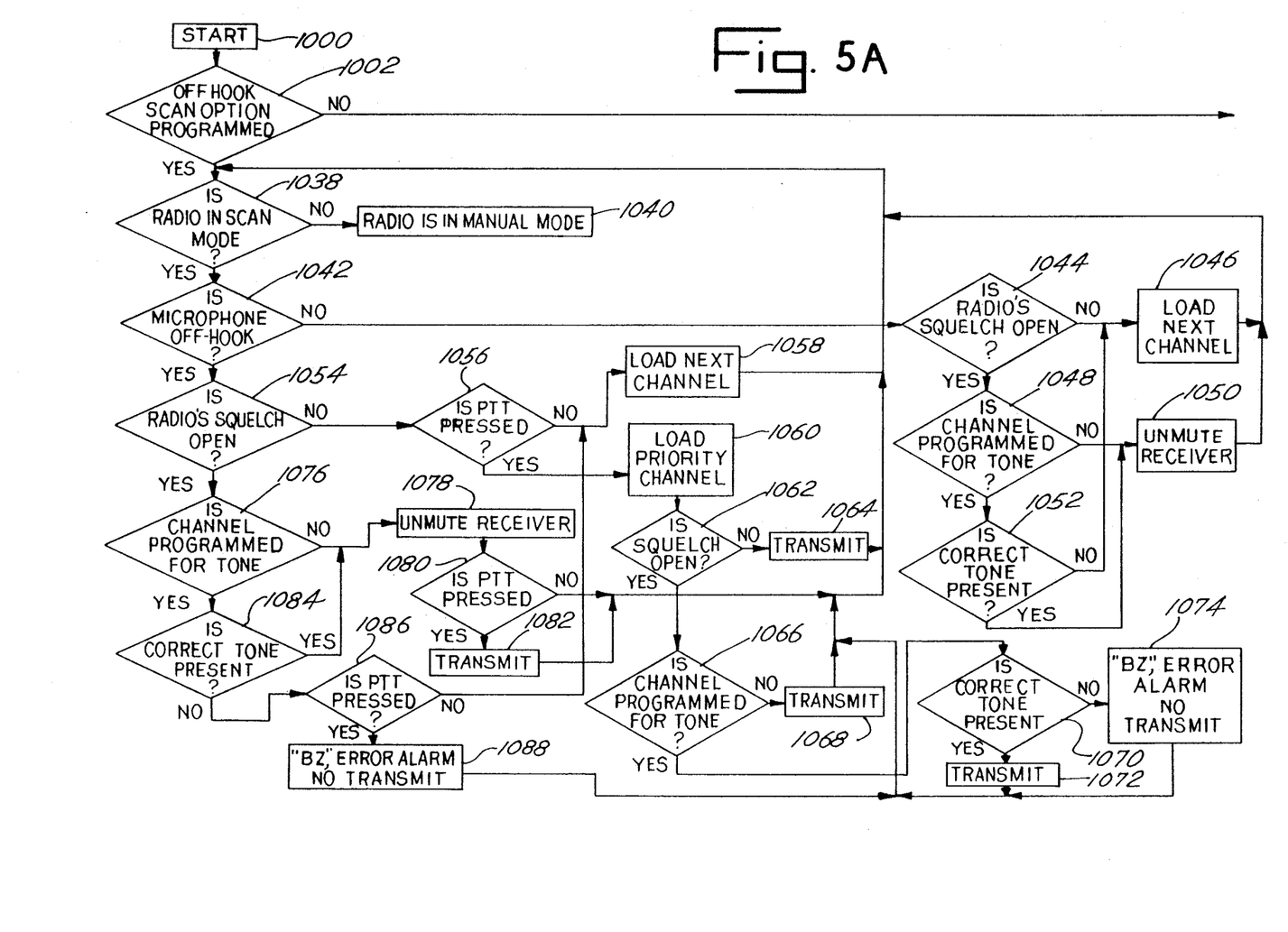

A more detailed block diagram of the controller's logic states is shown in FIG. 5. Referring to FIG. 5a, the controller 42, receives the start up instructions from the initialization circuit at step 1000. The controller 42 then receives the initialization sequence such that the controller 42 begins functioning.

At step 1002, the controller 42 inquires whether or not the off hook scan option has been programmed, with the internal memory control, to be operable. If not, the controller 42 moves to step 1004, as shown in FIG. 5b. The controller there checks whether the transceiver 10 is in the scan mode. If not, the transceiver 10 is in manual mode (step 1006) and, thus, the functions of the controller 42 are substantially reduced.

If the transceiver 10 is in scan mode, however, as shown in step 1008, the controller 42 inquires whether it is receiving an on hook signal. If the microphone 12 is on hook, the controller 42 checks, at step 1010, whether or not the transceiver squelch is open. If the squelch is closed, indicating that no signal is being received, the next channel is loaded in, according to the sequence in memory, and the transceiver 10 continues scanning, a shown in step 1012.

If the squelch is open, however, the controller inquires, at step 1014, whether the channel has been programmed for tone such that the operator should only be able to receive over particular channels. If this is not the case, the broadcast amplifier 110 is enabled at step 1016, such that the operator will hear the broadcast talk signal.

If the channel is programmed for tone, however, the controller inquires, at step 1018, whether the correct tone is present. If not, again the next channel is loaded in by the controller at step 1012, according to the input from the memory 44, and the transceiver 10 continues scanning. Otherwise, the amplifier 110 is enabled, as shown at step 1020, such that, again, the operator can hear the broadcast talk signal.

If the operator does then take the microphone 12 off hook, as shown at step 1008, the controller checks whether the squelch is open and thus whether a signal is being received at step 1022. If the squelch is not open, the priority channel is loaded in by the controller at step 1024. The controller then inquires, at step 1026, whether the squelch is open on the priority channel. If the squelch is not open, the amplifier 110 is muted at step 1028.

If the squelch is open, however, the receiver is unmuted at step 1030, and the controller inquires, at step 1032, whether the press-to-talk button is depressed. If so, the transmitter is enabled and transmission occurs at step 1034. If, however, the push-to-talk button is not depressed, the controller moves to step 1036.

If the microphone remains off hook, the controller again moves to step 1026 to determine whether or not the squelch is open and thus whether there is activity on the channel and whether the operator may properly talk. If the microphone 12 has gone to the on hook condition, however, this is taken as an indication that the operator no longer is interested in transmitting. At step 1004, the controller then checks for the transceiver being in the scan mode.

Referring back to FIG. 5a, if the controller determines, at step 1002, that the off hook scan option has been programed, the controller determines, at step 1038, whether the transceiver has been placed in the scan mode. If not, the transceiver is in manual mode, and the controller's activities are again limited. See step 1040. If the transceiver 10 is in scan mode, however, the controller determines, at step 1042, whether the microphone 12 is on or off hook.

If the microphone 12 is on hook, the controller will then, as before, determine, at step 1044, whether the transceiver squelch is open. If not, the controller receives the next channel from the memory, at step 1046, and continues with the scanning operation at step 1038.

If the squelch is open, however, again the controller determines whether the channel is programmed for tone, at step 1048. If not, the amplifier 110 is unmuted at step 1050, and the controller moves back to step 1038. If the channel is programmed for tone, however, and the correct tone is present, again, at step 1052, the amplifier 110 is unmuted, and the controller moves back to step 1038. If the correct tone is not present, however, the transceiver loads in the next channel at step 1046, and continues scanning. This occurs, since the transceiver is in the scan mode, but no transmission is possible on the current channel that the transceiver is presently on.

If the off hook option is programmed, the transceiver 10 is in scan mode, and the microphone is off hook, at step 1054, the controller inquires whether or not the squelch is open and thus, whether transmission is permissible. If the squelch is not open, the controller inquires, at step 1056, whether the PTT button is pressed. If not, at step 1058, the controller loads in the next channel in the predetermined sequence.

If the PTT button is depressed, however, the controller loads in the priority channel at step 1060. The controller inquires, at step 1062, whether the squelch is open and, thus, whether transmission is permissible on the priority channel. If the squelch is closed, transmission occurs at step 1064. If the squelch is open, however, at step 1066, the controller determines whether the channel again is programmed for tone. If not, transmission occurs at step 1068. If the channel is programmed for tone, at step 1070 the controller inquires whether the correct tone is present. If it is, then transmission occurs at step 1072. If the tone is not correct, no transmission occurs, and an error signal is sent to activate the alarm at step 1074.

If, however, the microphone is determined to be off hook at step 1042 and the radio squelch is determined to be open at step 1054, the controller inquires whether the channel is programmed for tone on the current, specific channel which the controller noted activity at step 1054. If it is not programmed for tone, the controller unmutes the receiver at step 1078, and then, at step 1080, determines whether the PTT button is depressed. If it is, transmission occurs at step 1082. Otherwise, the inquiry begins again at step 1038.

If, however, at step 1076, the channel was determined by the controller to be programmed for tone, the controller determines, at step 1084, whether the correct tone is present. If so, the unmuting of the receiver and possible transmission occurs at steps 1078 through 1082. If the correct tone was not present, however, the controller determines, at step 1086, whether the PTT button is depressed. If it is depressed, no transmission occurs, and the alarm is activated at step 1088.

If it is not depressed, however, no alarm occurs. The controller simply loads in the next channel step 1058 and the scanning process continues.

Although the foregoing description of the preferred embodiment will enable a person of ordinary skill in the art to make and use the same, the following detailed assembly language listing for the microprocessor is included. The assembly language listing provides detailed information concerning the programming and operation of the overall control system. Additional detailed features of the control system will become apparent to thsoe skilled in the art from reviewing the following program.

```
;------------------------------------------------------
;                 R A M   S T O R A G E
;------------------------------------------------------

;------------------------------------------------------
;
;------------------------------------------------------
AC3      .EQU    4
LED2     .EQU    5
SNLST1   .EQU    6   ; SCAN LIST CHANS  1-8
SNLST2   .EQU    7   ; SCAN LIST CHANS  9-16
SQDLY    .EQU    8   ; SQuelch DELaY (Time on chan w/no sig. before scan)
LSTFG7   .EQU    9   ; LAST FLAG7
REG6     .EQU    10  ; WHEN MSB CLEARED WILL ALLOW ENTERING OF DIGITS
REG8     .EQU    11  ; COUNTS DIGITS ENTERED IN PROGRAM MODE
```

```
LASTCH   .EQU   12 ; (WAS REG37)
INTACC   .EQU   13 ; INTerrupt ACCumulator
BEPCNT   .EQU   14
TIMUP    .EQU   15 ; TIMe that must elapse for UP finger before next key accepted
;----------------------------------------------------------------
;
;----------------------------------------------------------------
TEMP2    .EQU   10H     ;ENTER, DELETE, PACK, FLASH, ERRBEEP, REVIEWING
ACH      .EQU   11H
ACL      .EQU   12H
;vvvvvvvvvvvvvvvvvvvvvvvvvvvvvvvvvvvvvvvvvvvvvvvvvvvvvvvvvvvvvvvv
FLAG2    .EQU   13H ;
DBNC     .EQU   80H ;BIT7 =1 KEYBOARD DEBOUNC
BEPCTR   .EQU   40H ;BIT6 =1 BEEP CONTROL
XMIT     .EQU   20H ;BIT5 =1 XMIT
VERF     .EQU   08H ;BIT3 =1 PROGRAMMING VERIFY ONLY MODE
PTTBCL   .EQU   04H ;BIT2 =1 PTT'D IN OFF HOOK SCAN
;BIT1-BIT0
; 0   0     RANGE 1 (134-174) 2.5    KHZ CHAN SPACING
; 1   0     RANGE 2 (134-174) 3.125 KHZ CHAN SPACING
; 0   1     RANGE 3 (310-512) 4.166 FUJITSU
;                 IF SET (DON'T FLOP CODE) FUJITSU
;^^^^^^^^^^^^^^^^^^^^^^^^^^^^^^^^^^^^^^^^^^^^^^^^^^^^^^^^^^^^^^^^
DATM     .EQU   14H
DATL     .EQU   15H
ACC      .EQU   16H
REG1     .EQU   17H
;vvvvvvvvvvvvvvvvvvvvvvvvvvvvvvvvvvvvvvvvvvvvvvvvvvvvvvvvvvvvvvvv
FLAG1    .EQU   18H ;SAVED IN NON-VOLATILE STORAGE WHEN RH256
;IF RH252 IS LOADED WITH FIN
                   ;BIT7 =1
                   ;BIT6 =1
                   ;BIT5 =1
T.M.     .EQU   10H ;BIT4 =1 Tone                   0= Monitor
DAYN     .EQU   08H ;BIT3 =1 NIGHT                  0= DAY
                   ;BIT2 =1
                   ;BIT1 =1
RH252    .EQU   01H ;BIT0 =1 RH252 =0 RH256
;^^^^^^^^^^^^^^^^^^^^^^^^^^^^^^^^^^^^^^^^^^^^^^^^^^^^^^^^^^^^^^^^
;vvvvvvvvvvvvvvvvvvvvvvvvvvvvvvvvvvvvvvvvvvvvvvvvvvvvvvvvvvvvvvvv
FLG3     .EQU   19H ;SAVED IN NON-VOLATILE STORAGE
SCAN     .EQU   80H ; 1=NO SCAN                     0= SCANNING
MSG      .EQU   40H ; 1=MSG LED OFF                 0= LED ON
PRIOR    .EQU   20H ; 1=PRIORITY LED ON             0= LED OFF
;        4   TEN'S DIGIT
;        3   DISPLAY
;        2   DISPLAY
;        1   DISPLAY
;        0   DISPLAY REGX     .EQU   1AH
LED1     .EQU   1BH
;vvvvvvvvvvvvvvvvvvvvvvvvvvvvvvvvvvvvvvvvvvvvvvvvvvvvvvvvvvvvvvvv
FLG7     .EQU   1CH ;
TONE     .EQU   80H ; BIT7 =1 TONE DECODED          0= NO TONE DECODED
HOOK1    .EQU   40H ; BIT6 =1 BEEN OFF HOOK         0= NOT BEEN OFF HOOK
PROG     .EQU   20H ; BIT5 =1 IN PROGRAM MODE       0= NOT IN PROG MODE
PSTORE   .EQU   10H ; BIT4 =1 P.CHN ACTIVE, CHN STORED 0= NO CHN IN STORAGE
         .EQU   08H
RFP      .EQU   04H ; BIT2 =1 RFP PROGRAMMER DETECTED (RH252)
SDLY     .EQU   02H ; BIT1 =1 SCAN DELAY,           0= NO SCAN DELAY
CPRIOR   .EQU   01H ; BIT0 =1 CHANGE PRIORITY CHANNEL 0= DON'T CHANGE P.CHN
;^^^^^^^^^^^^^^^^^^^^^^^^^^^^^^^^^^^^^^^^^^^^^^^^^^^^^^^^^^^^^^^^
KEY      .EQU   1DH
TEMP     .EQU   1EH     ;USED IN KEYBRD,BCDBIN,REVIEW
TEMP1    .EQU   1FH
```

```
;--------------------------------------------------------------------------
;
;--------------------------------------------------------------------------
PRGBUF  .EQU    32  ;32 THRU 40 USED IN PROGRAMMING
                    ;         USED IN PROGRAMMING
FCNT    .EQU    41
PCHAN   .EQU    42  ;USER PROGRAMMABLE PRIORITY CHANNEL
PTMR1   .EQU    43  ; Priority TiMeR1 decremented every millisecond
                    ; to get count of every 10 milliseconds.
PTMR2   .EQU    44  ; Priority TiMeR2 decremented every 10 milliseconds.
                    ; for priority sample of 2 second, load with '200'.
PCNT    .EQU    45  ; Priority CouNTer used in scan
RTIME1  .EQU    46  ;
TONTM   .EQU    47  ; TONe TiMer (used to time the 500 msec decode time)
STAT1   .EQU    48
;vvvvvvvvvvvvvvvvvvvvvvvvvvvvvvvvvvvvvvvvvvvvvvvvvvvvvvvvvvvvvvvvvvvvvvvvv
;STAT1:
;BIT7   X
;BIT6   Scan Delay      0= .68 SEC   0= 1.3 SEC   1= 2.0 SEC
;BIT5                   0=           1=           0=
;BIT4   X
;BIT3   X
;BIT2   Time Out Timer  0= NONE      0= 30 SEC    0= 60 SEC   1= 120 SEC
;BIT1                   0=           0=           1=          0=
;BIT0                   0=           1=           0=          0=
;^^^^^^^^^^^^^^^^^^^^^^^^^^^^^^^^^^^^^^^^^^^^^^^^^^^^^^^^^^^^^^^^^^^^^^^^^
STAT2   .EQU    49
;vvvvvvvvvvvvvvvvvvvvvvvvvvvvvvvvvvvvvvvvvvvvvvvvvvvvvvvvvvvvvvvvvvvvvvvvv
;BIT7   Decode Interrupt Delay Codes 0= EXT  0= 100 mSEC  0= 200 mSEC ... 1=900 mSEC
;BIT6                                0=      0=           0=              0=
;BIT5                                0=      0=           1=              0=
;BIT4                                0=      1=           0=              1=
;BIT3   X
;BIT2   Beep Enable          0 = Normal Keyboard Beep  1 = No Beep
;BIT1   Channel 1 on power up 0 = Normal status        1 = Go to Channel 1
;BIT0   Off hook goes to Priority 0 = Normal 16 Channel 1 = Follow rules.

STAT3   .EQU    50
;vvvvvvvvvvvvvvvvvvvvvvvvvvvvvvvvvvvvvvvvvvvvvvvvvvvvvvvvvvvvvvvvvvvvvvvvv
;BIT7   X
;BIT6   X
;BIT5   0=100 mSEC               1 = 300 mSEC TRANSMITTER DELAY ENABLED
;BIT4   OFF HOOK SCAN            0 = Normal TONE/MONITOR    1 = IN OHS
;BIT3   X
;BIT2   X
;BIT1   X
;BIT0   X
DISP1   .EQU    60
DISP2   .EQU    61
DISP3   .EQU    62
DISP4   .EQU    63
DISP5   .EQU    64
DISP6   .EQU    65

BCDTN   .EQU    69  ; BCD TONE NUMBER
;--------------------------------------------------------------------------
;
;--------------------------------------------------------------------------
BTONE   .EQU    70  ; BINARY TONE NUMBER
ACLL    .EQU    71  ; LAST BYTE SHIFTED OUT TO SYNTHESIZER
CSB     .EQU    72
LSB     .EQU    73
TOTM1   .EQU    74  ; TIME OUT TIMER JIFFIES FOR 1 SECOND
TOTM2   .EQU    75  ; TIME OUT TIMER
LCDM    .EQU    76
LCDC    .EQU    77
LCDL    .EQU    78

LED1I   .EQU    79  ; LED1 IMAGE
LED2I   .EQU    80  ;
;USED IN PC PROGRAMMER
PMODE   .EQU    81
```

```
WRADD    .EQU    82
RECEIV   .EQU    83
FLAGII   .EQU    84        ;IMAGES TO REDUCE WRITES TO MEMORY
FLG3I    .EQU    85        ;ONLY SAVE TO EEROM WHEN VALUES CHANGE
PORT2I   .EQU    86        ;PORT2 IMAGE
DDR2I    .EQU    87        ;DDR2 IMAGE
SQTST    .EQU    88        ;SQUELCH LINE IMAGE AFTER UNMUTING IN TONE ROUTINES
PORTOI   .EQU    89        ;PORTO IMAGE FOR HOOK SWITCH
CTEMP    .EQU    90        ;TEMP REGISTER USED IN CORE
VECTOR:  TM      R12,#PROG          ;FLG7
         JP      NZ,INPRG           ;BR IF IN PROG MODE
         CALL    CHKBCL
         JR      Z,ONN
         CALL    SYNTR

;(((((((((((((((((((( START OF OFFHOOK ROUTINE ))))))))))))))))))))
OFHOOK:  TM      R12,#HOOK1         ;(FLG7) WHEN OFF HOOK FIRST
         JR      NZ,OFHKK           ;TIME,CHECK N.D.
         OR      R12,#HOOK1         ;(FLG7) SET BEEN OFF HOOK
         CALL    MSGOFF             ;(FLG3) MSG LED OFF
         TM      STAT2,#BIT0        ;SEE IF WE ARE "NORMAL 16 CHAN"
         JR      NZ,FLRLS
         TM      R9,#PRIOR          ;FLG3
         JR      NZ,GP              ;BR IF IN PRIORITY
FLRLS:   TM      R8,#BIT0
         JR      NZ,OF252           ;RH252 OFFHOOK
         TM      R9,#SCAN           ;FLG3
         JR      NZ,OFHKKK          ;BR IF IN MANUAL
OF252:   OR      PORTO,#BIT2        ;RH252 SET LINE HIGH TO SEE IF F1 NECESSARY
         TM      R12,#SDLY          ;FLG7
         JR      NZ,OFHKKK          ;BR IF IN SCAN DELAY
         CALL    UNMUTE
         CALL    GETONE
         JR      Z,NT               ;BR IF NO RECEIVE TONE
         TM      R12,#TONE          ;FLG7
         JR      NZ,OFHKKK
         JR      GP
NT:      TM      PORT2,#SQUELCH
         JR      NZ,OFHKKK          ;BR IF SIGNAL
GP:      CALL    GETP
OFHKKK:  JP      OUBS               ;LOAD SYNTH N.D.

PITT:    TM      PORTO,#ZUN         ;TEST FOR PTT
         JR      NZ,OFNK1
         CALL    PTT                ;ALLOW PTT
OFHKK:   CALL    UNMUTE
         CALL    CHSCX
;-------------------------------------------------------------------
;$$$$$$$$$$$$$$$$$$$$$$$$$$$$$$$$$$$$$$$$$$$$$$$$$$$$$$$$$$$$$$$$$$

;MAIN LOOP FOR OFFHOOK
OFNK1:   CALL    KEYBRD             ;CHK KEYBRD
         CALL    CHKBCL
ONN:     JR      NZ,PTTT
;$$$$$$$$$$$$$$$$$$$$$$$$$$$$$$$$$$$$$$$$$$$$$$$$$$$$$$$$$$$$$$$$$$
;-------------------------------------------------------------------
;(((((((((((((((((((( END OF OFFHOOK ROUTINE ))))))))))))))))))))

;(((((((((((((((((((( START OF ONHOOK ROUTINE ))))))))))))))))))))
ONHOOK:  AND     R12,#25H           ;(FLG7) MSG PRIOR OFF
         AND     R9,#0E0H           ;(FLG3) NO TONE , NO CHAN IN STORAGE
         LD      R6,LASTCH          ;ACC
         AND     R6,#0FH            ;RESET OFF HOOK & SCAN DELAY
         ADD     R9,R6              ;FLG3,ACC
         LD      PTMR2,#200         ;RELOAD 2 SECOND TIMER
         LD      PCNT,#3            ;PRIORITY COUNTER USED IN SCAN
         CALL    SYNTR
ONNK1:   CALL    GETONE
         JP      Z,NTONE
```

```
;XXXXXXXXXXXXXXXXXXXXXXXXXXXXXXXXXXXXXXXXXXXXXXXXXXXXXXXXXXXXXXXXXXX
;    WILL STAY IN THIS SECTION OF CODE FOR SUB-AUDIABLE.EXT DECODE TIME   ;X
;    IF SIGNAL PRESENT AND NO KEYS PRESSED. EXTERNAL INTERRUPTS ALLOWED   ;X
;XXXXXXXXXXXXXXXXXXXXXXXXXXXXXXXXXXXXXXXXXXXXXXXXXXXXXXXXXXXXXXXXXXX
         DI                                                              ;X
;SET UP TIME TO WAIT ON EXTERNAL DECODER                                  ;X
         LD    R6,STAT2         ;100 MSEC-900 MSEC (+/- 10 MSEC RESOLUTION) ;X
         AND   R6,#0F0H                                                   ;X
         CALL  BCDBIN                                                     ;X
         LD    TONTM,R6                                                   ;X
         LD    0FBH,#20H        ;INTERRUPT MASK REGISTER       IMR        ;X
                                ;TIMER1 ENABLED, TIMER0 DISABLED          ;X
                                ;AND EXT. INT DISABLED                    ;X
         AND   R6,R6                                                      ;X
         JR    NZ,RCVMN         ;BR IF EXTERNAL                           ;X
                                                                          ;X
;SET UP TIME TO WAIT ON CTCSS DECODER                                     ;X
CTCSS:   LD    RLCNT,#10        ;* INITIALIZE RECEIVER LOOP COUNT         ;X
                                ;* I.E. CARRIER SQUELCH DETECT            ;X
         CALL  RINIT                                                      ;X
         LD    TONTM,#50                                                  ;X
         LD    0FBH,#34H        ;INTERRUPT MASK REGISTER       IMR        ;X
                                ;TIMER1, TIMER0 AND EXT. INT ENABLED      ;X
RCVMN:   EI                                                               ;X
RMAN:    CALL  CKKCL            ;CHECK FOR OFF HOOK                       ;X
         JR    NZ,OUTDX                                                   ;X

TM    STAT2,#0F0H                                                ;X
         JR    Z,CTCSS1                                                   ;X
;S A M P L E       E X T E R N A L      D E C O D E R                     ;X
         CLR   RLCNT                                                      ;X
         TM    PORT3,#BIT1                                                ;X
         JR    NZ,MUTIT         ;BR NO EXTERNAL DECODER SIGNAL VALID      ;X

TM    SQTST,#BIT4      ;CK SQUELCHED CONDITION                   ;X
         JR    Z,CTCSS1         ;BR SQUELCHED                             ;X
         CALL  TONIX            ;SET TONE, MSG FLAG                       ;X
         JR    CTCSS1
MUTIT:   AND   R12,#TONE^XOFFH  ;(FLG7) SET TO NO TONE                    ;X
CTCSS1:  CALL  UNMUTE           ;AND LOAD SQTST REGISTER WITH PORT2 IMAGE ;X
         TM    R12,#TONE        ;FLG7                                     ;X
         JR    NZ,NMUT          ;BR TONE                                  ;X
         CALL  MUTE                                                       ;X
         JR    WASTM                                                      ;X

NMUT:    CALL  SVSTAT                                                     ;X
WASTM:   TCM   SQTST,#BIT4      ;SQTST SET IN UNMUTE                      ;X
         JR    NZ,SLVIT         ;BR IF NO SIGNAL (SQUELCHED)              ;X
         LD    R10,#7           ;REGX                                     ;X
WAST:    DJNZ  R6,WAST          ;(ACC) DO NOTHING SO THAT THE SQUELCH     ;X
         DJNZ  R10,WAST         ;LINE IS NOT TESTED BUT ONCE              ;X
                                ;EVERY 8 MSEC                             ;X
         TM    R8,#BIT0         ;(FLAG1) SET TO RH252                     ;X
         JR    NZ,NLVIT         ;BR IF RH252                              ;X

RG256:   TCM   PORT0,#0FH       ;CALL CKKY IF RH256                       ;X
SLVIT:   JR    NZ,LVIT          ;BR IF NO SIGNAL OR KEY HIT               ;X

NLVIT:   CP    TONTM,#0         ;500 mSEC +8 TO 0 mSEC                    ;X
         JR    Z,OUT3                                                     ;X
         TM    PORT0,#20H       ;TEST FOR PTT                             ;X
         JR    Z,OUTDX          ;IF PTT'D LEAVE PREVIOUS                  ;X
         DEC   RLCNT            ;- IF THE RECEIVER LOOP COUNTER IS        ;X
         JR    NZ,RMAN          ;- NOT ZERO GO TO RMAN                    ;X
         AND   R12,#SDLY^XOFFH  ;(FLG7) RESET SCAN DELAY                  ;X
LVIT:    AND   R12,#TONE^XOFFH  ;(FLG7) SET TO NO TONE                    ;X
         JR    OUTDX                                                      ;X
```

```
;HERE IF IN MONITOR                                                        ;X
NTONX:  CALL    MSGOFF                                                     ;X
        TM      R9,#SCAN        ;FLG3                                      ;X
        JR      PL,NTONE        ;BR IF SCANNING                            ;X
        CALL    OUT11           ;RELOAD DISPLAY                            ;X
NTONE:  CALL    UNMUTE                                                     ;X
OUT3:   TM      PORT2,#BIT4     ;CK SQUELCH                                ;X
        JR      Z,LVIT          ;BR NO SIGNAL                              ;X
        OR      R12,#SDLY       ;FLG7                                      ;X
        CALL    CKSCX                                                      ;X
;XXXXXXXXXXXXXXXXXXXXXXXXXXXXXXXXXXXXXXXXXXXXXXXXXXXXXXXXXXXXXXXXXXXXX
OUTDX:  DI
        LD      0FBH,#30H       ;INTERRUPT MASK REGISTER     IMR
        EI                      ;TIMER1, TIMER0 ENABLED AND EXT. INT DISABLED
        LD      SQDELY,#68      ;SCAN DELAY .68 SEC
        TM      STAT1,#060H
        JR      Z,WSS
        LD      SQDELY,#200     ;SCAN DELAY 2   SEC
        TM      STAT1,#BIT6
        JR      NZ,WSS
        LD      SQDELY,#130     ;SCAN DELAY 1.3 SEC
WSS:    CALL    CHKBCL
        JP      NZ,OFHOOK
        CALL    CHKPTT
        CALL    KEYBRD
        TM      R3,#PTTBCL      ;FLAG2
        JR      NZ,NPRIO
        TM      R9,#PRIOR       ;FLG3
        JR      Z,NPRIO
        TM      R12,#PSTORE     ;FLG7
        JR      NZ,NPRIO        ;ALREADY BEEN IN PRIORITY
        CP      PTMR2,#0
        JR      NZ,NPRIO
;***********************************************************************
;   P R I O R I T Y   S A M P L I N G   H A N D L I N G
;***********************************************************************
DPRIO:  LD      PTMR2,#200      ;RELOAD 2 SECOND TIMER
        LD      LASTCH,R9       ;(FLG3) DO-PRIORITY
        CALL    GETP
        LD      LSTFG7,R12      ;FLG7
        LD      R6,R12          ;ACC,FLG7
        AND     R6,#7DH         ;(ACC) NO SCAN DELAY, NO TONE FOUND
        OR      R6,#PSTORE      ;(ACC) PRIORITY CHANNEL ACTIVE & IN STORAGE
TRYA:   LD      R12,R6          ;FLG7,ACC

; LED1 (g  -b  -a  -f    a'& b'-e-d-c)
        CP      R11,#0          ;LED1, SHOW SAMP CHAN IF NOT BLANKED.
        JR      Z,TRYB          ;BR IF DISPLAY BLANKED

SEGON:  CALL    OUT11
TRYB:   CALL    SYNTR
NTOX:   CALL    UNMUTE
        CALL    MUTE
        TM      SQTST,#BIT4     ;SQTST LOADED IN UNMUTE
        JR      Z,TRYC          ;BR NO SIGNAL
ONNXX:  JP      ONNK1           ;BR SIGNAL FOUND ON PRIORITY CHANNEL
;***********************************************************************
NPRIO:  TM      PORT2,#BIT4     ;CK SQUELCH
        JR      NZ,ONNXX        ;BR SIGNAL

;>>>>>>>>>>>>>>>>>>>>  N O   S I G N A L   <<<<<<<<<<<<<<<<<<<<<<<
        TM      R12,#SDLY       ;FLG7
        JR      Z,TRYC          ;BR NO SCAN DELAY
;NO SIGNAL IN SCAN DELAY SITUATION
        CP      SQDELY,#0
        JR      NZ,WSS          ;BR BACK UP FOR SCAN DELAY
```

```
;NO SIGNAL, SCAN DELAY TIMES OUT (IF THERE WAS A SIGNAL)
TRYC:   TM      R12,#PSTORE     ;FLG7
        JR      Z,NDLY1         ;JMP IF NOT IN STORAGE
        TM      R3,#PTTBCL      ;FLAG2
        JR      NZ,NDLY1        ;NO RESTORE IF PTT'S IN OFF HOOK SCAN

;RESTORE LAST CHANNEL BEFORE PRIORITY SAMPLE
        OR      R9,#9FH         ;FLG3 (IF IN STORAGE LSTFG7 IS VALID)
        AND     R9,LASTCH       ;(FLG3) KEEP MSG & PRIORITY STATUS RESTORE CHAN
        LD      R6,LSTFG7       ;(ACC)RESTORE SCAN DELAY & TONE BIT
        JR      TRYA

NDLY1:  AND     R12,#SDLY^XOFFH ;(FLG7) RESET SCAN DELAY
        OR      PORT0,#BIT2     ;RH252 SET LINE HIGH TO FORCE SCAN MODE
                                ;IF SWITCH IN CENTER POSITION.
        TM      R9,#SCAN        ;FLG3
        JR      NZ,ONHKX        ;BR NOT SCANNING
        TM      R3,#PTTBCL      ;FLAG2
        JR      NZ,ONHKX        ;NO SCAN IF PTT'S IN OFF HOOK SCAN

;**********************************************************
;       S C A N   H A N D L I N G
;**********************************************************
        CALL    GETCHN          ;SEND OUT SYNTH
        LD      LASTCH,R9       ;FLG3
        CALL    BLKDSP          ;BLANK DISPLAY
        TM      R9,#PRIOR       ;FLG3
        JR      Z,ONHKX         ;BR PRIORITY OFF
        DEC     PCNT            ;EVERY THIRD TIME
        JR      NZ,ONHKX
        LD      PCNT,#3
        JR      DPRIO           ;SAMPLE PRIORITY
;(((((((((((((((((( END OF ONHOOK ROUTINE ))))))))))))))))))
```

A single, preferred embodiment of the present invention has been described herein. It is to be understood, however, that changes and modifications can be made without departing from the true scope and spirit of the present invention. This true scope and spirit are defined by the following claims, to be interpreted in light of the foregoing specification.

We claim:

1. A method for controlling channels, including a priority channel, used for scanning and transmitting by a mobile transceiver, said transceiver including a main unit for scanning a plurality of channels, an external microphone having a talk button for receiving an audio signal and responsively sending a talk signal to said main unit when said talk button is depressed, and a hook for holding said microphone in a predetermined position relative to said main unit, comprising the steps of:

scanning channels, by monitoring one specific channel at a time, and substantially continuing said scanning when said microphone is off hook;

detecting channel activity on said one specific channel being monitored and discontinuing said scanning during said channel activity and during a predetermined wait period after an absence of said channel activity on said one specific channel; and processing a talk signal on said one specific channel, when said talk signal occurs during said predetermined wait period following channel activity on said one specific channel, and processing said talk signal on said priority channel, when said talk signal occurs during scanning.

2. A method as claimed in claim 1 further comprising the step of sending an off hook signal to said main unit when said microphone is taken off hook.

3. A method as claimed in claim 2 wherein said scanning of channels is performed according to a predetermined sequence.

4. A method as claimed in claim 3 further comprising the step of beginning again said scanning after said microphone has been placed back on hook.

5. A method as claimed in claim 4 wherein said main unit includes a manual control that provides a scanning instruction signal and wherein said scanning begins again upon receiving said scanning instruction from said manual control.

6. A method as claimed in claim 5 wherein said main unit includes a listing of correct tones for specific channels and said main unit decodes a predetermined tone on each specific channel and wherein said method further includes the step of only processing of said talk signal on a specific channel when said tone decoded on said specific channel is correct.

7. A method as claimed in claim 6 wherein said main unit includes means for generating an alarm and said method further includes the step of generating said alarm when said talk button is pushed while said channel tone is incorrect.

8. A method as claimed in claim 5 wherein said main unit includes a transmitter, receiver, and single, mobile antenna interconnected to both said transmitter and receiver, said main unit further including a radio frequency switch controlled by said talk button on said microphone for decoupling said transmitter and receiver from said mobile antenna.

9. A method as claimed in claim 5 further comprising the steps of detecting channel activity on said priority channel and inhibiting processing of said talk signal on said priority channel during channel activity on said priority channel.

10. A method as claimed in claim 8 wherein said main unit includes a frequency generator to set predetermined channels and said frequency generator is controlled by a crystal.

11. A method as claimed in claim 8 wherein said main unit includes a frequency generator to set predetermined channels and said frequency generator is controlled by a frequency synthesizer.

12. A method as claimed in claim 11 wherein an alarm is activated when said talk button is pressed continuously for a predetermined period of time.

13. A mobile scanning transceiver for receiving and transmitting signals on a plurality of channels comprising, in combination:

a main unit including a signal processor and controller;

an external microphone having a talk button, said microphone receiving an audio signal and responsively sending a talk signal to said main unit when said talk button is depressed; and a hook for holding said microphone in a predetermined position relative to said main unit;

said signal processor scanning channels and processing talk signals;

said controller instructing said signal processor to scan channels, by monitoring one specific channel at a time, said scanning substantially continuing when said microphone is off hook, said controller detecting channel activity on said one specific channel being monitored and discontinuing said scanning during said channel activity and during a predetermined wait period after an absence of said channel activity on said one specific channel, said controller instructing said signal processor to process a talk signal on said one specific channel, when said talk signal occurs within said predetermined wait period following channel activity on said one specific channel, and said controller instructing said signal processor to process said talk signal on said priority channel, when said talk signal occurs during scanning.

14. A transceiver as claimed in claim 13 wherein said microphone transmits an off hook signal to said main unit upon being taken off hook.

15. A transceiver as claimed in claim 14 wherein said main unit further comprises a memory, interconnected to said controller, for storing a predetermined sequence of channels and said priority channel and wherein said controller instructs said signal processor to scan channels according to said predetermined sequence stored in said memory.

16. A transceiver as claimed in claim 15 wherein said controller further includes inhibit means for inhibiting processing of said talk signal on said priority channel during channel activity on said priority channel.

17. A transceiver as claimed in claim 15 wherein said signal processor includes a transmitter, receiver, and a single, mobile antenna interconnected to both said transmitter and receiver, said signal processor further including a radio frequency switch controlled by said talk button on said microphone for decoupling said transmitter and receiver from said mobile antenna.

18. A transceiver as claimed in claim 17 wherein said signal processor includes a frequency generator to set predetermined channels and said frequency generator is controlled by a crystal.

19. A transceiver as claimed in claim 17 wherein said signal processor includes a frequency generator to set predetermined channels and said frequency generator is controlled by a frequency synthesizer.

20. A transceiver as claimed in claim 19 wherein an alarm is activated when said talk button is pressed continuously for a predetermined period of time.

21. A transceiver as claimed in claim 13 wherein said controller instructs said signal processor to begin again said scanning after said microphone has been placed back on hook.

22. A transceiver as claimed in claim 21 further comprising manual controls for providing a scanning instruction signal to said controller, enabling said controller to begin again said scanning.

23. A transceiver as claimed in claim 22 wherein said main unit further includes a tone memory of specific channels and corresponding correct tones and said main unit further includes a decoder for decoding tones on specific channels and for inhibiting said processing of said talk signal on a specific channel when said tone decoded on said specific channel is incorrect.

24. A transceiver as claimed in claim 23 wherein said main unit includes means for generating an alarm upon receiving a signal that an operator is trying to process a talk signal on a specific channel when said specific channel has an incorrect tone.

* * * * *